Sept. 29, 1959 D. J. CRAWFORD 2,906,871

DIODE CLIPPING CIRCUIT

Filed Nov. 10, 1954

*INVENTOR.*

DAVID J. CRAWFORD

*BY* Ralph C. Dustin

ATTORNEY

United States Patent Office 2,906,871

Patented Sept. 29, 1959

2,906,871

DIODE CLIPPING CIRCUIT

David J. Crawford, Poughkeepsie, N.Y., assignor to International Business Machines Corporation, New York, N.Y., a corporation of New York Application November 10, 1954, Serial No. 467,954

5 Claims. (Cl. 250—27)

The present invention relates to a clipping circuit, and more particularly to an improved diode clipping circuit which presents a relatively low loading factor to the input driving source.

One method of clipping an input signal commonly employed in the prior art utilizes a germanium diode between the input signal source and a fixed voltage source functioning as a "clipping" or limiting potential. With this method, however, the back resistance of the diode presents an undesirable loading factor upon the input driving source. In many cases the limitation imposed thereby is so severe as to require excessive input power merely to drive the back resistance of the diode. A second disadvantage associated with this method of clipping is that the amplitude of the input signal is unduly restricted, due to the limitations of back voltage which can be developed across such diodes without damage thereto.

In accordance with the general principles of the present invention, there is provided an improved diode clipping circuit wherein the desired clipping action is obtained without presenting an undesirable loading factor in the form of the back resistance of the clipping diode to the input signal source. By means of the apparatus herein described, the back potential developed across the clipping diode is reduced to a very nominal value which is substantially independent of the input signal level, thereby overcoming the limitation of signal level input associated with conventional clipping circuits.

Accordingly, one of the objects of the present invention is to provide an improved clipping circuit wherein the power dissipated in driving the back resistance of the clipping diode is eliminated or substantially reduced.

Another object of the present invention is to provide an improved diode clipping circuit wherein the back voltage developed across a clipping diode is substantially reduced and wherein the magnitude of the back voltage developed across the diode is substantially independent of the input signal level.

Another object of the present invention is to provide an improved diode clipping circuit wherein the output signal level is substantially independent of circuit parameter variation.

Another and still further object of the present invention is to provide an improved cathode follower type circuit wherein both upper and lower limits of the output signal are maintained at predetermined levels by means of clipping diodes in both the input and output circuits of said cathode follower type.

Another object of the present invention is to provide an improved diode clipping circuit wherein the delay in fall time of an input signal may be substantially reduced.

Other objects of the invention will be pointed out in the following description and claims, which disclose, by way of examples, the prniciple of the invention and the best mode, which has been contemplated, of applying that principle.

As is well known in the electrical art, a clipping circuit is employed for amplitude selection between predetermined limits, i.e., the selection of all values of an input or output signal greater or less than predetermined reference levels or lying between an upper and a lower reference level. The output waveform generally has a flat top or bottom or both. The present apparatus functions to maintain the extremities of the input signals at predetermined levels while presenting a nominal impedance to the input signals. The present apparatus is employed in conjunction with an amplifier circuit to clip either the lower, upper or both levels of the input signal, subject to the following requirements of the amplifier circuit:

(1) A gain of unity or less between the input and output positions of the amplifier at which the clipping circuit is interconnected.

(2) An output signal in phase with the input.

(3) The output of such circuit connected to a fixed reference level or levels depending on the level or levels to be clipped.

(4) The output of the circuit varying as a function of the input.

Thus the present invention may be employed in a magnetic amplifier circuit, power amplifier circuit, etc. having the above enumerated characteristics. Another circuit possessing such characteristics is a cathode follower. In the ensuing description, the subject apparatus will be shown and described as associated with a cathode follower for illustrating a preferred embodiment of the present invention.

A cathode follower circuit is a vacuum tube wide band power amplifier having its load impedance in the cathode circuit. Such circuits are characterized by a high input and a low output impedance, and are widely employed to couple an input signal from a high impedance source to a low impedance load without polarity inversion and with minimum distortion. The output of a cathode-follower circuit has no fixed upper or lower reference level, as does, for example, the output of in inverter, but varies with the level of the input signal.

Figure 1:
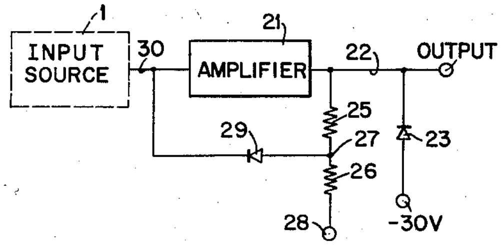
Fig. 1 illustrates in block schematic form the general principle of the present invention as applied to an amplifier circuit.

Referring now to the drawings and more particularly to Fig. 1 thereof, there is shown in block schematic form a circuit illustrating the principles of the present invention as applied to clipping the lower level of an input signal. A signal from input source 1 is applied to amplifier 21 through conductor 30, this amplifier possessing the characteristics previously enumerated. Output conductor 22 is connected to an output clipping circuit comprising diode 23 and a source of 30 volts negative potential, this circuit serving to establish a reference potential at output conductor 22 and at junction 27 connected to the anode of diode 29. A voltage divider network comprising resistors 25 and 26 connected at junction 27 is interconnected between a source of negative potential, shown as terminal 28, and amplifier output conductor 22. A diode 29 is interconnected between junction 27 of the voltage divider network and input conductor 30. A voltage divider network is illustrated at the output of the circuit since it may be desirable to compensate between the D.C. input and output signal levels. However, if the amplifier circuit has exactly unity gain, a voltage divider network would not be required and diode 29 could be connected directly between output conductor 22 and input conductor 30. With the amplifier output connected to a source of −30 volts in the above described manner, the resistance values of the voltage divider network are so proportioned that the potential level at junction 27 will be slightly less than the reference level, for example −34 volts. This difference in potential levels will be explained in greater detail hereinafter.

As is well known in the electrical art, a diode is a nonlinear asymmetric circuit component containing two electrodes, a cathode and an anode or plate. If a positive potential, relative to that applied to the cathode, is applied to the anode, a current will flow through the diode determined by the magnitude of the applied potential and the nature of the diode. If the diode anode potential is negative with respect to the cathode, the diode functions as an extremely high resistance to limit current flow to a negligible amount. The diodes employed in the preferred embodiment are germanium type diodes having a nominal forward resistance of 50–200 ohms and a minimum back resistance in the order of 400 kilohms. As herein shown and described, diode 29 (Fig. 1) is a "clipping diode" which is employed to limit the negative excursion of the input signal to the level of junction 27, which may be, for example, −34 volts. Should the input signal on input terminal 30 drop below this level, diode 29 conducts, thereby effectively maintaining a lower input reference level. The subject circuit will be described in greater detail hereinafter with reference to Figures 2 through 5.

Figure 2:
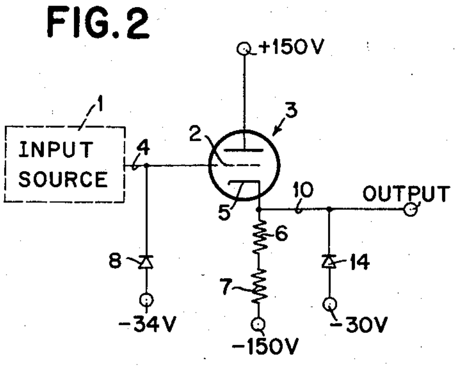
Fig. 2 illustrates in schematic form a diode clipping circuit of the type employed in the prior art for clipping the lower level of the input signal.

Referring now to Fig. 2, there is illustrated in schematic form a conventional diode clipping circuit associated with a cathode follower. A signal source 1 is connected to control grid 2 of cathode follower circuit 3 through a conductor 4. Cathode follower circuit 3 further includes cathode 5 and associated cathode desistors 6 and 7. A diode 8 is shown interconnected between a source of −34 volts potential and the input conductor 4, the cathode and anode of the diode being connected to the input conductor and negative potential source respectively.

Output conductor 10 is employed to connect the output from cathode 5, developed across cathode resistors 6 and 7, to a load circuit, not shown. An output diode 14, having its anode connected to a clipping potential of −30 volts and its cathode connected to output conductor 10, is employed to maintain the assumed lower output reference level of −30 volts. The fixed potential applied to the output is necessary for the satisfactory operation of the circuit for a predetermined clipping level.

In the ensuing description, various input levels will be employed to illustrate the principle of operation of the subject circuit. With respect to the output levels, the minimum or lower and maximum or upper levels specified are −30 volts and +10 volts respectively. Where both output levels are utilized, the output signal will be constrained to vary between the above stated levels.

While the above described circuit arrangement of the prior art will produce the desired clipping action, there are corresponding severe limitations imposed thereby which limit both the input signal level and disspiate the driving power from input source 1 which would be utilized in driving the load.

With respect to the first of these limitations, germanium diodes of the type illustrated and described herein have characteristics such that if an excessive voltage in the back direction is applied thereacross, they deteriorate. Deterioration of a diode results in decreasing the back resistance of the diode, and generally increasing the forward resistance. If the back voltage is sufficiently high, the diode will be destroyed the first time such a voltage is applied. Repetition of a high back voltage pulse or a continuing high back voltage of lesser amplitude across the diode will result in deterioration of the diode at a more gradual rate. The net back potential across a diode is that potential by which the anode of a diode is negative with respect to the cathode.

A serious limitation imposed by the circuit illustrated in Fig. 2 is the permissible back voltage which can be developed across the clipping diode. Assuming a positive input signal, the net back voltage developed across diode 8 is the sum of 34 volts plus the amplitude of the input signal. With respect to germanium diodes of the type employed in the preferred embodiment, the maximum back voltage which can be applied without damaging the diode is approximately 50 volts. Under this limitation, the maximum input signal level would be limited to the net potential difference between 34 and 50, or +16 volts. However, continuous repetition of an input signal even at this level, may result in rapid deterioration of the diode with a corresponding reduction in its useful life. From the above description it is obvious that the maximum input signal which can be tolerated in the circuit arrangement illustrated in Fig. 2 is unduly restricted.

A second limitation of the conventional clipping circuit illustrated in Fig. 2 is imposed by power considerations, i.e., the power required from the input source to drive the back resistance of the clipping diode. Assuming a nominal input signal level of +10 volts is applied from input source 1, a net back voltage of 44 volts is developed across diode 8. Under this condition, the diode will draw considerable current from the input source, resulting in power being dissipated across the diode according to the formula $I^2R$, where R is the back resistance of the diode. Since the input power supplied to a circuit is frequently limited, sufficient power to drive the clipping diode and the load may not be available. The back resistance of the diode presents such a severe loading factor to the driving source that excessive power is required merely to drive the back resistance of the clipping diode.

Figure 3:
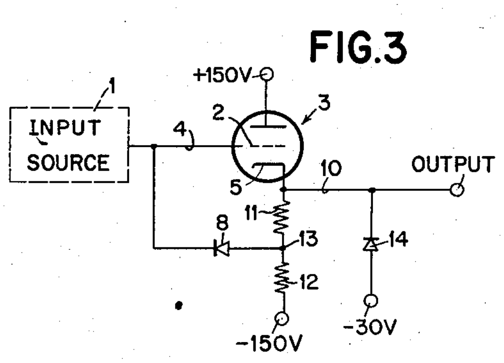
Fig. 3 illustrates in schematic form an improved diode clipping circuit for clipping the lower level of the input signal while limiting the effect of the diode back resistance.

To overcome the driving power and input signal level limitations above described, and at the same time obtain the desired clipping action required to prevent the lower level of the output signals from dropping below −30 volts, the circuit arrangement illutrated in Fig. 3 is employed.

Referring now to Fig. 3, the input signal is applied from signal source 1 to the control grid 2 of the cathode follower circuit 3. Cathode resistors 11 and 12, connected at junction 13, comprise a voltage divider network. Assuming the negative excursion of the input signal does not drop below −30 volts, the resistance values of the voltage divider network connected between −30 and −150 volts are so proportioned as to develop a potential of −34 volts at junction 13 and the anode of diode 8. If the input signal level falls below −34 volts, diode 8 conducts, thus clipping the input signal at the −34 volt level. The output signal is maintained at a minimum level of −30 volts by means of output diode 14. In addition to establishing a reference potential as heretofore described, diode 14 ensures a minimum signal level output despite variation or deterioration of the tube or other circuit components. With the low level input signal specified above, there is a potential drop across resistor 11 of approximately 4 volts, while the drop across diode 8 is negligible. A grid to cathode bias of −4 volts is employed in the preferred embodiment. If the anode of diode 8 was connected directly to the cathode 5 rather than through resistor 11, the tube 3 would be effectively short circuited. Under such condition, therefore, the operation of the circuit is not dissimilar to that illustrated in and described with reference to the conventional diode clipping circuit of Fig. 2.

Assuming now that a positive input signal is applied to control grid 2 of cathode follower 3, such signal being of an order of amplitude of +10 volts, the signal level at output conductor 10 will be approximately +11 volts, while the potential at junction 13 will be approximately +6 volts. The net back voltage across diode 8 is therefore 4 volts, as contrasted with 44 volts in the conventional diode clipping circuit of Fig. 1 under the identical input signal level. This back voltage across diode 8 is a result of the non-linear characteristics of the cathode follower and the fact that a cathode follower is not a unity gain circuit.

From the above description, it is apparent that since the back voltage developed across diode 8 has been decreased by more than a factor of 10, diode 8 will draw proportionately less current from the input source resulting in a lower loading factor and decreased power loss. Since the potential at junction 13 of the voltage divider network varies as the input signal level applied to control grid 2, no limit is imposed on the upper level of the input signal by clipping diode 8. The upper livel of the input signal is limited only to a level at which grid current is drawn.

While the circuit shown in Fig. 3 is employed to clip the lower signal level, a similar circuit arrangement, illustrated in Fig. 4 and described hereinafter, may be employed to clip the upper level of the input signal.

Figure 4:
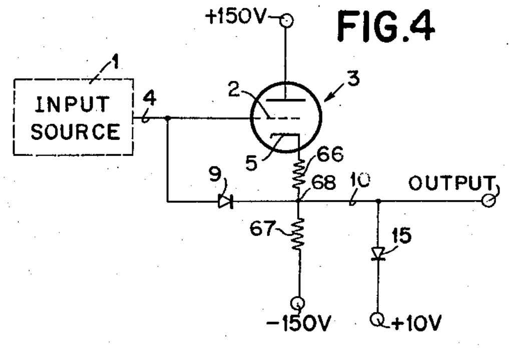
Fig. 4 illustrates in schematic form an improved diode clipping circuit for clipping the upper level of the input signal while limiting the effect of the diode back resistance.

Referring now to Fig. 4, there is shown in black schematic form a clipping circuit designed to clip the upper level of the input signal at +10 volts. The input signal from signal source 1 is applied to control grid 2 of the cathode follower circuit 3 via input conductor 4. Diode 9, connected between input conductor 4 and junction 68 of cathode resistors 66 and 67, has its polarity reversed as compared to the circuit arrangement of Fig. 3. Output diode 15 is similarly reversed in polarity as compared to diode 14 in Fig. 3, and connected to a source of 10 volts positive potential, to thereby clip the upper level of the output signal at this level. When the input signal attempts to rise above the +10 volt clipping level, diode 9 conducts, thereby clipping the input signal at this level, while cathode resistor 66 functions as a bias resistor to limit the plate dissipation and prevent overloading the tube. Cathode resistors 66 and 67 connected at junction 68 comprise a voltage divider network which maintains the potential at junction 68 at a value depending on the level of the input signal.

By means of the circuit illustrated in Fig. 4, if the input signal rises above the +10 volt level, diodes 9 and 15 conduct and the signal level above +10 volts is shunted through these diodes to the +10 volt source. When the input signal reverses and swings in a negative direction, the output of the circuit and the potential at junction 68 follow closely, thereby limiting the back potential developed acros diode 9. The potential at junction 68 of the cathode voltage divider network is equal to the cathode potential less the potential drop across resistor 66, the value of which will be selected to provide the desired operating bias for a particular application. Since the back potential across the input clipping diode is reduced from that which would be obtained in conventional diode clipping circuits, the loading effect on the input source is reduced proportionately to the same extent as the circuit previously described with reference to Fig. 3.

The circuit arrangement of Fig. 4, described above, also functions to reduce circuit delay in the same manner as the circuit of Figure 3. The circuit delay eliminated will be that delay required for the input signal to fall from its maximum level to the +10 volt clipping level.

Figure 5:
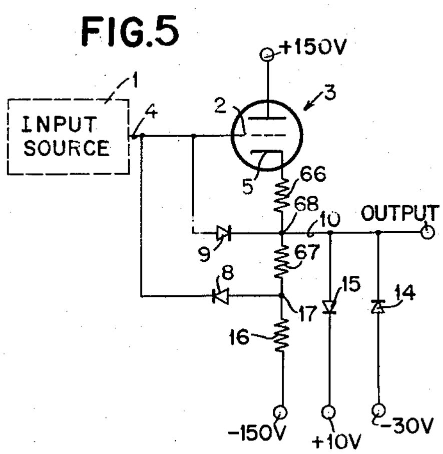
Fig. 5 illustrates in schematic form an improved diode clipping circuit for clipping both upper and lower levels of the input signal while limiting the effects of the back resistance of the input diodes.

Referring now to Fig. 5, there is illustrated in black schematic form a clipping circuit designed to clip both the upper and lower level of the input signal. In the ensuing description, the amplitude of the input signal will be again assumed to vary between +30 and −60 volts, while the output signal will be clipped at the +10 and −30 volt levels respectively.

The input signal is applied by signal source 1 to control grid 2 of cathode follower circuit 3 via input conductor 4. Diodes 9 and 15 operate to clip the upper level of the input signal at +10 volts in the manner previously described with reference to Fig. 5. Junction 68, connecting resistors 66 and 67 in the voltage divider network, is normally maintained at a level of +10 volts during the positive portion of the input signal. Resistor 16, connected to resistor 67 at junction 17, is also a part of the voltage divider network. The potential at junction 17 is at +6 volts during the positive portion of the input signal and at −34 volt level during the negative portion of the input signal so that the back potential across diode 8 is limited to 4 volts under both conditions. Resistor 66 functions as a biasing resistor during the time when the upper clipping action is taking place, as previously described with reference to Fig. 4. Diode 8 clips the lower level of the input signal at approximately −34 volts, while diode 14 clips the lower level of the output signal at −30 volts. By means of the above described circuit, the input signal may be clipped at the assumed upper and lower levels of +10 and −34 volts with relatively negligible loading effect on the driving source. No clipping action takes place at the input within the range of +10 to −34 volts.

The clipping circuits heretofore described may be employed in the manner illustrated, i.e., associated with a cathode follower or they may be employed without the associated cathode follower in other electronic circuits. In the first instance, the cathode follower utilizing the clipping circuits heretofore described may operate independently or as an output stage of an electronic circuit where such electronic circuit requirements dictate use of a cathode follower ouput. Examples of such circuits are D.C. level setter circuits or D.C. inverter circuits, where the additional driving power or impedence matching characteristics of the cathode follower are desired. In the latter instance, the clipping circuits may be employed as already noted in any amplifier circuit where it is desired to clip either or both levels of the input signal. The requirements for using the subject clipping circuits have been pointed out earlier.

While a fixed potential source at the output of the circuit has been employed throughout the description as illustrative of a circuit clipping at a fixed level, the present apparatus is not limited thereto. A variable output signal such as a modulating potential from an outside source might be employed where it is desired to modulate the output signal or clip said signal at variable levels.

While there have been shown and described and pointed out the fundamental novel features of the invention as applied to a plurality of embodiments, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A clipping circuit adapted to limit the amplitude of an input signal from a driving source while presenting a relatively low loading factor to said driving source comprising an amplifier having an input circuit connected to said driving source and an output circuit including a unidirectional conductive device connected to a source of reference potential, said output circuit further including a point at which the potential varies as a direct function of the instantaneous value of said input signal, said amplifier being operative to produce an output signal substantially in phase with said input signal, and a unidirectional conductive device having one of its elements connected to respond to the signal level at said point and said point on said output circuit and another of its elements connected to said input circuit to clip said input signal at a predetermined level.

2. A circuit adapted to clip at least one level of an input signal while presenting a relatively low loading factor to a driving source comprising, in combination, an amplifier having an input and an output circuit and adapted to produce an output signal varying instantaneously as a function of and substantially in phase with said input signal, said output circuit including a point wherein the gain of the output signal with respect to the input signal does not exceed unity and the potential varies as a direct function of the instantaneous value of said input signal, means for applying a predetermined means reference potential through a unidirectional conductive device to said output circuit and a diode interconnected directly between said point on said output circuit and said input circuit whereby the back potential developed across said diode remains relatively constant despite the variations of said input signal.

3. An electronic circuit adapted to clip the lower level of each input signal applied thereto while presenting a low impedance to the driving source supplying said input signals comprising, in combination, an amplifier having an input circuit and an output circuit and operative to produce an output signal substantially in phase with said input signal, said input circuit connected to said driving source, said output circuit including an impedance network, said impedance network including a point at which the gain is no greater than unity with respect to said input signal, said point having a potential which varies as a direct function of the instantaneous value of said input signal, a source of constant potential, a unidirectional conductive device connecting said source of constant potential to said output circuit to establish a lower reference potential and a clipping circuit interconnected between said point on said impedance network and said input circuit of said amplifier and adapted to clip the lower level of said input signal.

4. An electronic circuit adapted to clip the upper level of each input signal applied thereto while presenting a low impedance to the driving source supplying said input signal comprising, in combination, an amplifier having an input circuit and an output circuit and operative to produce an output signal in phase with said input signal, means for connecting said input circuit to said driving source, said output circuit including an impedance network, said impedance network including a point thereon having a gain no greater than unity with respect to said input signal and a potential which varies as a direct function of the instantaneous value of said input signal, a source of constant potential connected to said output circuit through a unidirectional conductive device to establish an upper reference potential and a clipping circuit interconnected directly between said point on said impedance network and said input circuit of said amplifier.

5. A circuit adapted to clip each input signal at predetermined upper and lower levels while presenting a relatively low loading factor to the driving source of said input signal comprising, in combination, an amplifier operative to produce an output signal substantially in phase with said input signal, said amplifier including an input circuit, means for applying said input signal to said input circuit, an output circuit associated with said amplifier, said output circuit including two points having potential magnitudes which vary as a direct function of the instantaneous value of said input signal, first and second discrete constant potentials, diode means for connecting said potentials to said output circuit to establish upper and lower reference levels for said output signals and a pair of unidirectional conductive circuits interconnected between said two points on said output circuit and said input circuit and adapted to clip the upper and lower portions of each input signal at said predetermined levels.

References Cited in the file of this patent

UNITED STATES PATENTS

| | | |
|---|---|---|
| 2,144,995 | Pulvari-Pulvermacher | Jan. 24, 1939 |
| 2,221,700 | Clapp | Nov. 12, 1940 |
| 2,434,929 | Holland et al | Jan. 27, 1948 |
| 2,469,860 | Cockrell | May 10, 1949 |
| 2,497,693 | Shea | Feb. 14, 1950 |
| 2,644,887 | Wolfe | July 7, 1953 |
| 2,821,626 | Freedman | Jan. 28, 1958 |

UNITED STATES PATENT OFFICE

CERTIFICATE OF CORRECTION

Patent No. 2,906,871 September 29, 1959

David J. Crawford

It is hereby certified that error appears in the printed specification of the above numbered patent requiring correction and that the said Letters Patent should read as corrected below.

Column 1, line 70, for "prniciple" read -- principle --; column 2, line 59, for "of in" read -- of an --; column 3, line 45, for "desistors" read -- resistors --; column 5, line 29, for "black" read -- block --; line 56, for "acros" read -- across --; same column 5, line 71, for "black" read -- block --; column 6, line 3, for "signal", second occurrence, read -- input --; line 75, strike out "and said point"; column 7, line 14, strike out "means".

Signed and sealed this 29th day of November 1960.

(SEAL)

Attest:

KARL H. AXLINE

Attesting Officer

ROBERT C. WATSON

Commissioner of Patents